STABILIZED CONSTANT CURRENT APPARATUS

Filed Nov. 25, 1968

INVENTOR.
WILLIAM A. DENNY
BY Harry A. Herbert Jr. and
George Fine
ATTORNEYS

United States Patent Office 3,546,564

Patented Dec. 8, 1970

3,546,564

STABILIZED CONSTANT CURRENT APPARATUS

William A. Denny, Surfside, Calif., assignor to the United States of America as represented by the Secretary of the Air Force

Filed Nov. 25, 1968, Ser. No. 778,568
Int. Cl. G05f *1/46*

U.S. Cl. 323—1 4 Claims

ABSTRACT OF THE DISCLOSURE

A constant current apparatus utilizing a high gain integrated-circuit differential amplifier to supply variable, ground referenced loads without the need of isolated power supplies and to minimize the effects of bias currents in the load currents.

BACKGROUND OF THE INVENTION

A constant current source, or current sink, is a widely used circuit. Most design efforts have the requirement for some highly stable constant current sources to be used in timing circuits, voltage references, A to D and D to A converters, and similar applications.

The majority of the presently available constant current sources which utilize a differential amplifier configuration require an isolated power supply. The power supply is usually more expensive and bulky than the complete constant current source.

The main reason that the isolated supply is usually required is that the load resistor which is being supplied by the constant current source is generally connected across the differential amplifier from an input to the output. Thus, since the output of the amplifier has to be free to go to any voltage required to correct for changes in load resistance, and the input side of the load resistor must be free to regulate the amplifier, neither end of the load resistor can be attached to ground, or to a reference voltage.

Another problem which occurs in the prior art devices is the source impedance into which the second input of the differential amplifier looks is a fixed resistance, while the first input sees the variation of load resistor. Since both inputs of the differential amplifier must supply bias current to the amplifier, there is linearity error in the constant current supplied to the load resistor. This linearity error may amount to a substantial percentage at low current levels. The present invention provides a unique circuit which will overcome these particular problems.

SUMMARY OF THE INVENTION

The present invention is a precision constant current source which is a basic and very useable circuit for various electronic circuit applications and which will give excellent stability for constant currents which range from a few micro amps to several milliamps to a load source whose resistance may be varying. The constant current apparatus utilizes a high gain integrated circuit differential amplifier with a positive feedback network from the output to the first differential amplifier input and a negative feedback network from the output to the second differential input. The present invention provides the necessary means to supply a variable, ground referenced load without the need for isolated power supplies and minimizes the detrimental effects of bias currents in the supplied constant current. By adding an emitter follower on the output of the amplifier, another order of magnitude of current could be obtained without any detrimental stability effect.

The present constant current apparatus overcomes the prior art problems of the linearity error in the constant current supplied to the load resistor and the inability to utilize a ground referenced load. This circuit which utilizes an integrated circuit differential amplifier can be packaged on a printed circuit load and will use only one square inch of space. The circuit can be adapted to function with most of the standard power supply voltages with but a few component value changes and, more important, it does not require an isolated supply.

Accordingly, it is an object of this invention to provide an improved constant current source.

It is another object of the present invention to provide a precision constant current apparatus for supplying a constant current to a variable, ground referenced load.

It is another object of the invention to provide a precision constant current apparatus which will supply a constant current to ground referenced loads without the use of isolated power supplies.

It is yet another object of the invention to provide a constant current apparatus to supply a constant current to a variable load without any linearity error due to bias currents in the inputs of a differential amplifier.

These and other advantages, features and objects of the invention will become more apparent from the following description taken in connection with the illustrative embodiment in the accompanying drawings.

DESCRIPTION OF THE PREFERRED EMBODIMENTS

Figure 1:
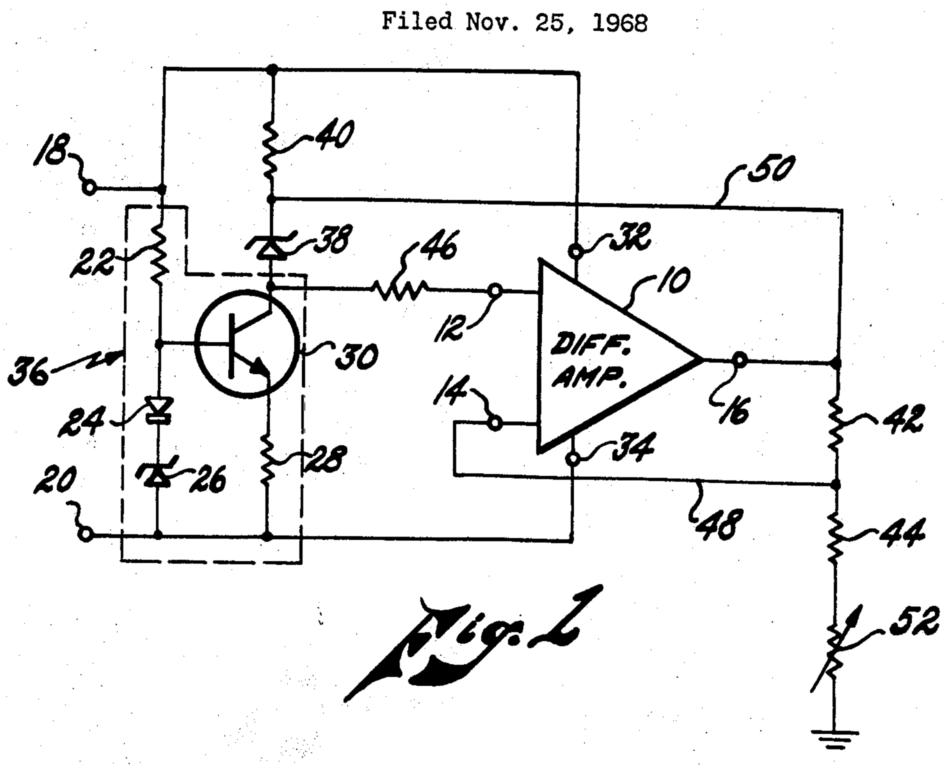
FIG. 1 is a schematic diagram of the precision constant current apparatus in accordance with this invention.

Referring now to FIG. 1, the precision constant current apparatus utilizes a high gain integrated-circuit type differential amplifier 10 having first and second input terminals 12, 14 and an output terminal 16. The operation of the constant current apparatus will be more clearly understood by the following discussion of the description and function of the circuit components. The standard power supply voltage at which the desired constant current is supplied to the load is applied at input terminals 18 and 20. A voltage having a first polarity is applied to terminal 18 and the opposite polarity is applied to terminal 20. The voltage at input terminals 18, 20 is applied to the constant current source 36 comprising transistor 30, resistors 22, 28, diode 24 and Zener diode 26. The constant current source 36 provides a constant current for voltage reference diode 38 and, although shown in a particular circuit configuration, may be any conventional constant current source. A temperature compensated Zener diode may be used as voltage reference diode 38. The applied standard power supply voltage also provides the supply voltages for differential amplifier 10 and is applied at supply terminals 32, 34. Current limiting resistor 40 limits the amount of current that differential amplifier 10 has to supply. Voltage reference diode 38 is used as a voltage level step down and sets the voltage across the current sensing resistor 42. Positive feedback control resistor 44 is used to control the amount of the positive feedback. A positive feedback network is formed by the connection 48 between input terminal 14 and the junction of current sensing resistor 42 and positive feedback control resistor 44. The negative feedback network is connected by line 50 between output terminal 16 and the junction of current limiting resistor 40 and voltage reference diode 38. Bias limiting resistor 46 which is used to regulate the bias current that is supplied to the differential amplifier 10, is connected between voltage reference diode 38 and input terminal 12. The variable load resistor 52 is connected between positive feedback control resistor 44 and ground.

Since this circuit has both positive and negative feedback, the positive feedback control resistor 44 is utilized to guarantee that the positive feedback is always less than the negative feedback signal. In the case where load resistor goes to 0 ohms, the positive feedback without the positive feedback control resistor 44 would be equal to unity. Since the negative feedback is equal to unity, the circuit could become unstable. Thus, by adding positive feedback control resistor 44, the positive feedback is the ratio $R42/(R42+R44)$, where R42 is the value of current sensing resistor 42 and R44 is the value of positive feedback control resistor 44. Bias limiting resistor 46 serves a very important function, which is to force current sensing resistor 42 to increase the current through load resistor by the amount of the bias current at input terminal 12 of the differential amplifier 10. Since the input terminals 12, 14 of the integrated circuit differential amplifier are very closely matched monolithic pair, the difference in bias currents between input terminals 12 and 14 of the integrated circuit differential amplifier is very small, typically 100 nano amps. Thus, the result of adding bias limiting resistor 46 is the same as putting a variable battery in series with voltage reference diode 38, the battery voltage being the product of the bias current times the value of bias limiting resistor 46. The value of bias limiting resistor 46 should be equal to the value of current sensing resistor 42. Thus, current sensing resistor 42 is forced to control the current through the load resistor such that regardless of the matched bias current at the input terminals 12, 14 of the differential amplifier 10, the constant current in the load resistor does not change.

Figure 2:
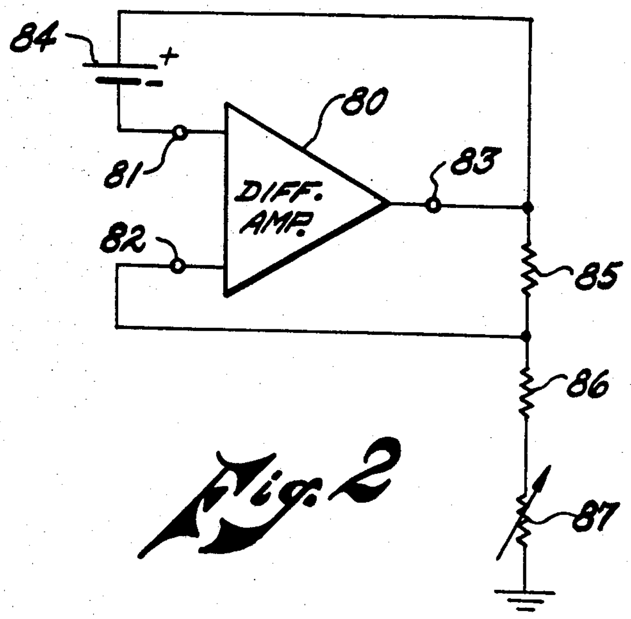
FIG. 2 is the equivalent schematic diagram of the circuit shown in FIG. 1.

In FIG. 2, the equivalent circuit of the schematic diagram of FIG. 1 is shown. The differential amplifier 80 has two input terminals 81, 82, and a single output terminal 83. Current sensing resistor 85 and positive feedback control resistor 86 are connected in series between output terminal 83 and load resistor 87. Load resistor 87 is connected between positive feedback control resistor 86 and ground. A positive feedback network is formed by the connection of input terminal 82 to the junction of current sensing resistor 85 and positive feedback control resistor 86. When the voltage levels at input terminals 81, 82 are equal, the output terminal 83 is zero. The battery 84 represents the drop across voltage reference diode 38 (FIG. 1) which may be a temperature compensated Zener reference diode. Battery 84 forms a negative feedback network across differential amplifier 80 and is connected between input terminal 81 and output terminal 83. Assuming an arbitrarily selected voltage for the battery 84 to be 6.2 volts, it may be seen that input terminal 81, the inverting input of the amplifier, 6.2 volts more negative than the amplifier output terminal 83. In order to establish equilibrium in the circuit, the amplifier output must increase (or decrease, depending on initial conditions) so that the voltage drop across the current sensing resistor 85 is very nearly equal to the value of battery 84.

The constant current of this circuit is given by Ohm's law therefore would be:

$$\frac{\text{Voltage battery 84}}{\text{Resistance 85}}=I$$

where I is the constant current for the circuit. Since neither input is restrained except for the voltage at either end of the current sensing resistor 85, the circuit is sensing only the voltage across the current sensing resistor 85. If the voltage across current sensing resistor 85 is constant, the current through the load resistance 87 will be constant since the only other current path is bias current at input terminal 82.

With a few modifications, there are several other uses for the constant current apparatus. The circuit provides an excellent voltage reference source which may be obtained by shorting out the bias limiting resistor 46 and grounding the positive feedback control resistor 44. The circuit could also be used as a transducer current source and amplifier. By replacing the load resistor 52 with a resistive type transducer and taking the output at the top of the current sensing resistor 42, the change in output voltage would be equal to the change in the transducer resistance times the constant current. Thus, the errors due to bridge and power amplifier circuitry will be eliminated.

Although the invention has been described with reference to a particular embodiment, it will be understood to those skilled in the art that the invention is capable of a variety of alternative embodiments within the spirit and scope of the appended claims.

I claim:

1. A constant current apparatus comprising in combination:

a first input terminal for receiving a voltage having a first polarity.

a second input terminal for receiving a voltage having a polarity opposite to said first polarity, a constant current supply means connected to said first and second input terminals and having an output terminal, a voltage reference means providing a stable temperature compensated reference voltage, current limiting means connected to said first input terminal and said voltage reference means, an integrated-circuit differential amplifier having first and second input terminals and an output terminal, constant current regulation means connected to said voltage reference means and said first input terminal of said differential amplifier, a negative feedback network connected to said output terminal of said differential amplifier and to the junction of said current limiting means and said voltage reference means, a current sensing means having an input and an output, said input of said current sensing means connected to said output of said differential amplifier, a positive feedback network connected to said output of said current sensing means and to said second input terminal of said differential amplifier, a positive feedback control means connected to the junction of said positive feedback network and said output of said current sensing means, and load means connected between said positive feedback control means and ground.

2. A constant current apparatus as defined in claim 1 wherein said voltage reference means in a Zener diode.

3. A constant current apparatus as defined in claim 1 wherein said current sensing means is a resistive network.

4. A constant current apparatus as defined in claim 1 wherein said constant current supply means further includes a semiconductor control device, a reference diode and current limiting means.

References Cited

UNITED STATES PATENTS

| | | | |
|---|---|---|---|
| 3,246,170 | 4/1966 | Olshan | 323—1UX |
| 3,250,922 | 5/1966 | Parham | 323—4UX |
| 3,417,319 | 12/1968 | Shaughnessy | 323—4 |

J D MILLER, Primary Examiner

A. D. PELLINEN, Assistant Examiner

U.S. Cl. X.R.

330—30